US008106355B1

(12) United States Patent
Lauber et al.

(10) Patent No.: US 8,106,355 B1
(45) Date of Patent: Jan. 31, 2012

(54) AUTOMATED INSPECTION USING CELL-CELL SUBTRACTION PERPENDICULAR TO STAGE MOTION DIRECTION

(75) Inventors: Jan Lauber, San Francisco, CA (US); Mark A. McCord, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 755 days.

(21) Appl. No.: 12/163,708

(22) Filed: Jun. 27, 2008

(51) Int. Cl.
*G21K 7/00* (2006.01)

(52) U.S. Cl. ........ 250/307; 250/306; 250/310; 250/311; 250/440.11; 250/492.3

(58) Field of Classification Search .................. None
See application file for complete search history.

(56) References Cited

U.S. PATENT DOCUMENTS

| 4,481,664 | A | 11/1984 | Linger et al. | |
| 4,891,699 | A * | 1/1990 | Hamada et al. | 348/415.1 |
| 5,659,172 | A | 8/1997 | Wagner et al. | |
| 6,175,417 | B1 | 1/2001 | Do et al. | |
| 6,248,988 | B1 * | 6/2001 | Krantz | 250/201.3 |
| 6,300,629 | B1 | 10/2001 | Lawrence | |
| 6,427,024 | B1 | 7/2002 | Bishop | |
| 6,452,677 | B1 | 9/2002 | Do et al. | |
| 6,649,919 | B2 * | 11/2003 | Chao et al. | 250/492.2 |
| 6,861,650 | B2 * | 3/2005 | Kondo et al. | 250/315.3 |
| 7,034,930 | B1 | 4/2006 | Subramanian et al. | |
| 7,369,236 | B1 | 5/2008 | Sali et al. | |
| 2001/0033683 | A1 * | 10/2001 | Tanaka et al. | 382/149 |
| 2002/0109088 | A1 * | 8/2002 | Nara et al. | 250/306 |
| 2002/0166964 | A1 * | 11/2002 | Talbot et al. | 250/307 |
| 2003/0155508 | A1 * | 8/2003 | Suzuki et al. | 250/310 |
| 2004/0086170 | A1 * | 5/2004 | Shishido et al. | 382/149 |
| 2005/0109938 | A1 * | 5/2005 | Miyai et al. | 250/311 |
| 2005/0205781 | A1 * | 9/2005 | Kimba | 250/311 |
| 2005/0263715 | A1 * | 12/2005 | Nakasuji et al. | 250/396 ML |
| 2006/0171593 | A1 * | 8/2006 | Hayakawa et al. | 382/209 |
| 2008/0078933 | A1 * | 4/2008 | Watanabe et al. | 250/307 |
| 2008/0100844 | A1 | 5/2008 | Sali et al. | |
| 2008/0101686 | A1 | 5/2008 | Sali et al. | |
| 2008/0317329 | A1 * | 12/2008 | Shibuya et al. | 382/149 |

FOREIGN PATENT DOCUMENTS

JP 03167456 * 7/1991

* cited by examiner

*Primary Examiner* — Robert Kim
*Assistant Examiner* — Michael Logie
(74) *Attorney, Agent, or Firm* — Okamoto & Benedicto LLP (57) ABSTRACT

One embodiment relates to an apparatus for automated inspection of a semiconductor substrate. Processor-executable code is configured to control the stage electronics to move the substrate using a continuous motion in a substrate-translation direction and is configured to control the beam to scan it across the surface of the substrate and collect corresponding image data, scan lines of the scan being along a scan-line direction perpendicular to the substrate-translation direction. Processor-executable code is also configured to select from the image data two cells of the repeating pattern on the surface of the substrate, the two cells being displaced from each other by one or multiple cell heights in the scan-line direction. Finally, processor-executable code is configured to generate a difference image by subtracting image data from said two cells on a pixel-by-pixel basis. Other embodiments, aspects and features are also disclosed.

5 Claims, 7 Drawing Sheets

AUTOMATED INSPECTION USING CELL-CELL SUBTRACTION PERPENDICULAR TO STAGE MOTION DIRECTION

BACKGROUND OF THE INVENTION

1. Technical Field

The present application relates generally to apparatus and methods for automated inspection in semiconductor manufacturing and the like.

2. Description of the Background Art

Semiconductor wafer inspection apparatus typically image the wafer surface by either one of two techniques. A first technique involves scanning a square area of a stationary wafer. After that area is scanned, the wafer is moved over by the width of that square to acquire the next image. A second technique involves continuously scanning the wafer surface while, at the same time, moving the stage on which the wafer is mounted.

The wafer surface often has repeating patterns. In order to detect defects, the following method may be used. Image sections of repeating patterns on the wafer surface, displaced by one or multiple cell widths in the direction of the stage movement, are subtracted from each other to form a difference image. Such a difference image may be used as the basis for the defect detection.

SUMMARY

One embodiment relates to an apparatus for automated inspection of a semiconductor substrate. Processor-executable code is configured to control the stage electronics to move the substrate using a continuous motion in a substrate-translation direction and is configured to control the beam to scan it across the surface of the substrate and collect corresponding image data, scan lines being along a scan-line direction perpendicular to the substrate-translation direction. Processor-executable code is also configured to select from the image data two cells of the repeating pattern on the surface of the substrate, the two cells being displaced from each other by one or multiple cell heights in the scan-line direction. Finally, processor-executable code is configured to generate a difference image by subtracting image data from said two cells on a pixel-by-pixel basis. Other embodiments, aspects, and features are also disclosed.

DETAILED DESCRIPTION

A substantial fraction of semiconductor wafer inspections are conducted on wafer patterns that repeat themselves in cells. These cells, such as a unit cell in a memory array, repeat themselves in both (x and y) directions. For example, the x-direction may be in the direction of the stage or substrate translation, and the y-direction may be the scan-line direction.

To compare images of two neighboring cells, the images are generally shifted by one or multiple cell widths in the direction of the stage movement (i.e. the x-direction), and the shifted image is then subtracted from the original image on a pixel-by-pixel basis to form a difference image for defect detection.

As discussed above, individual pixels that are subtracted from each other are acquired a time period, $\Delta t$, apart, where $\Delta t$ is equal to the scan speed (in units of scan lines per second) times the cell width (in units of scan lines). For electron beam apparatus, $\Delta t$ typically ranges from about 100 microseconds to 10 milliseconds.

However, applicants note that the longer $\Delta t$ is, the more time for the inspector to accumulate systematic errors, such as beam deflection noise and stage motion uncertainty. Applicants further note that small perturbations to the beam and/or the continuous stage movement introduces positional distortion into the images that can only be partially corrected by image alignment. This additional noise makes the inspection tool less sensitive to the smallest physical defects and/or the weakest voltage-contrast defects. This is because the defect detection threshold has to be raised to avoid the flagging of false defects due to these misalignments.

The above-described problems and disadvantages may be overcome by utilizing apparatus and methods disclosed in the present application. As described below, the present application discloses apparatus and methods which can reduce positional distortion in difference data. With this reduced distortion, the defect detection threshold may be lowered without resulting in an overabundance of false-positive defect detections.

Figure 1A:
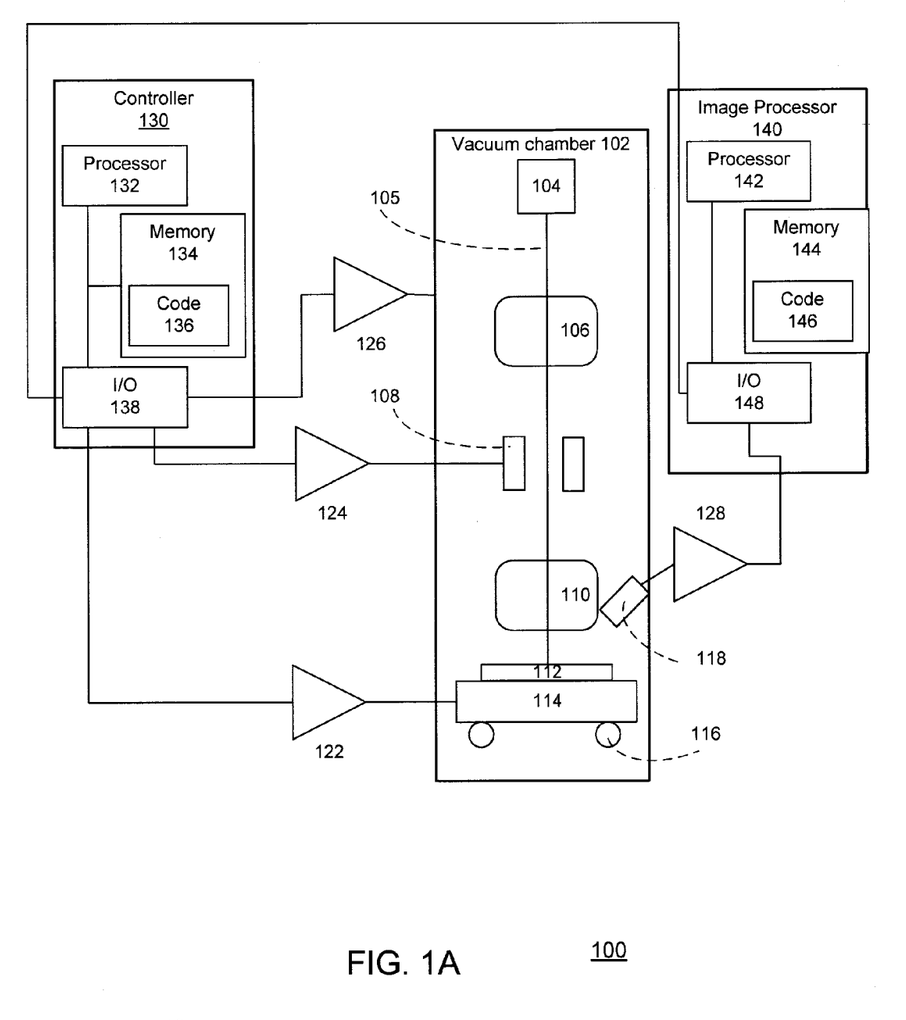
FIG. 1A is a schematic diagram of an electron beam apparatus in accordance with an embodiment of the invention.

FIG. 1A is a schematic diagram of an electron beam apparatus 100 in accordance with an embodiment of the invention. The apparatus 100 includes, but is not limited to, a vacuum chamber 102 of an electron beam column, a controller 130, and an image processor 140.

Within the vacuum chamber 102 of the column are various components, including an electron source 104, a condenser electron lens 106, a controllable deflector 108, an objective electron lens 110, a substrate specimen 112, a movable stage 114, and an electron detector 118. The electron source 104 generates electrons which are used to form an electron beam 105. The condenser lenses 106 may be utilized to focus the beam 105 into a smaller diameter beam. The deflectors 108 may comprise a magnetic or an electrostatic deflector. The objective lens 110 may be utilized to focus the beam 105 onto a spot on a surface of the substrate 112. The substrate 112 is held under the beam 105 by the stage 114. The stage 114 may be moved the substrate 112 under the beam 105 using a controllable stage-moving mechanism 116. The detector 118 may be configured to detect secondary and/or scattered electrons resulting from the impingement of the primary electron beam 105 onto the substrate 112.

The controller 130 may include a processor 132, a memory 134, and input/output (I/O) circuitry 138. The memory 134 may include processor-executable code 136 and other data. The I/O circuitry 138 may be used by the controller to communicate with external electronic devices. The I/O circuitry 138 may be coupled to stage control circuitry 122, deflector control circuitry 124, and other column control circuitry 126. The stage-moving mechanism 116 may be controlled by the controller 130 by way of the stage control circuitry 122. The beam deflectors 108 may be controlled by the controller 130 by way of the deflector control circuitry 124. The deflector 108 may be controlled so as to scan the beam spot over different locations on the surface of the substrate 112. The other column control circuitry 126 may be coupled to circuitry for the electron source 104 so as to control beam current and/or beam voltage. The other column control circuitry 126 may also be coupled to the lenses 106 and/or 110 to control the field of view of the column.

Detection electronics 128 may be coupled to the detector 118. The image processor 140 may be configured to receive data from the detection electronics 128. The image processor 140 may also be communicatively coupled to the controller 130.

In accordance with an embodiment of the invention, the apparatus 100 may be configured such that a user may select a swath scanning mode. In the swath scanning mode, the stage 114 may be moved in a relatively slow and continuous (or nearly continuous) linear motion under the electron beam column. Meanwhile, the electron beam 105 may be scanned linearly back-and-forth along scan lines in a raster pattern so as to cover the moving substrate in swath-like segments. Alternatively, instead of raster scanning of an electron beam 105 that is focused onto a spot, the electron beam apparatus 100 may be configured to focus the electron beam 105 such that it is spread out in one dimension so as to form a linear-shaped electron beam. Such a linear-shaped electron beam may illuminate an entire area of a scan line for line-by-line image acquisition. In such a configuration, all the pixels of a scan line may be acquired simultaneously, for example, using a time-delay integration (TDI) detector.

Image data collected during the swath-like scanning may then be processed by the image processor 140. This image data may be processed in accordance to the methods disclosed herein to detect and verify defects in a relatively rapid and efficient manner which allows for high-throughput inspection of substrates. The image processor 140 may include a processor 142, a memory 144, and input/output (I/O) circuitry 148. The memory 144 may include processor-executable code 146 and other data. The I/O circuitry 148 may be used by the controller to communicate with external electronic devices. The I/O circuitry 148 may be coupled to detection electronics 128 and the controller 130.

Figure 1B:
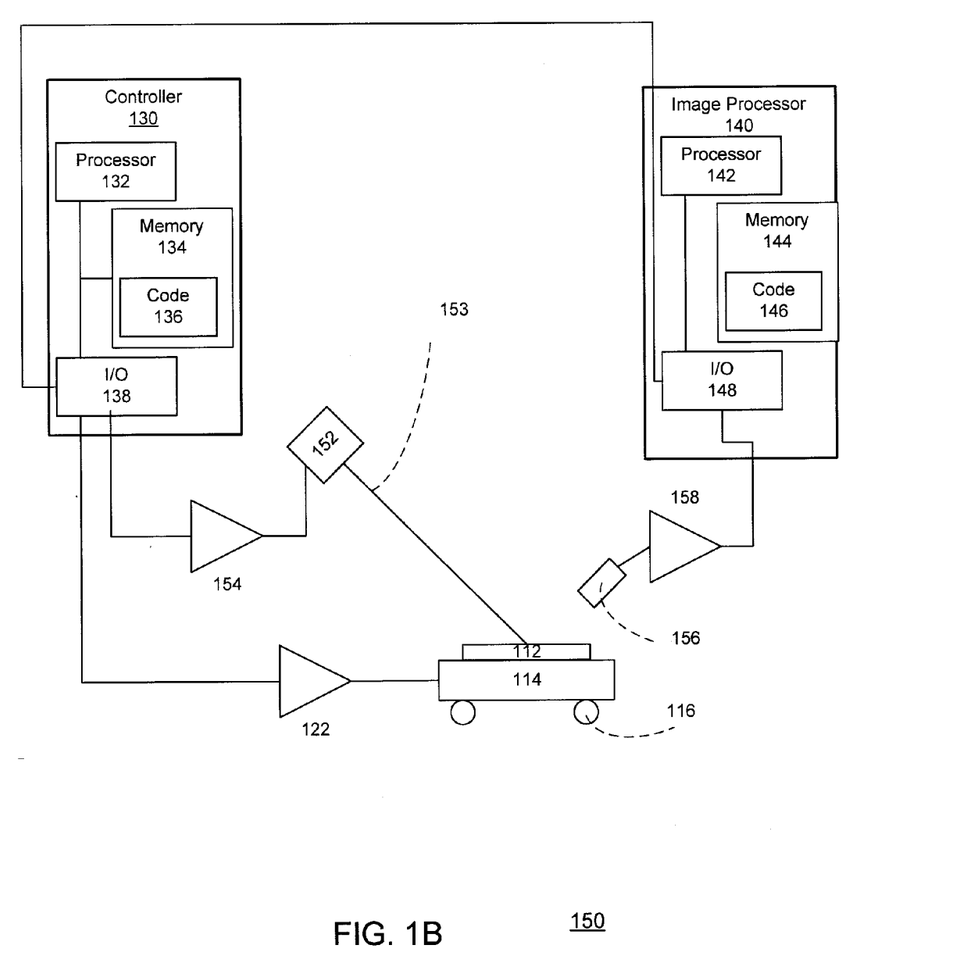
FIG. 1B is a schematic diagram of an optical beam apparatus in accordance with an embodiment of the invention.

FIG. 1B is a schematic diagram of an optical beam apparatus 150 in accordance with an embodiment of the invention. The apparatus 150 includes, but is not limited to, a controllable source 152 for an optical beam 153, an optical detector 156, a controller 130, and an image processor 140.

The controllable source 152 generates an optical beam 153 which is scanned across a surface of the substrate 112. The substrate 112 is held under the optical beam 153 by the stage 114. The stage 114 may be moved the substrate 112 under the beam 152 using a controllable stage-moving mechanism 116. The optical detector 156 may be configured to detect scattered photons resulting from the impingement of the optical beam 153 onto the substrate 112.

The controller 130 may include a processor 132, a memory 134, and input/output (I/O) circuitry 138. The memory 134 may include processor-executable code 136 and other data. The I/O circuitry 138 may be used by the controller to communicate with external electronic devices. The I/O circuitry 138 may be coupled to stage control circuitry 122, and scan control circuitry 154. The stage-moving mechanism 116 may be controlled by the controller 130 by way of the stage control circuitry 122. The scanning of the optical beam 153 may be controlled by the controller 130 by way of the scan control circuitry 154.

Detection electronics 158 may be coupled to the optical detector 156. The image processor 140 may be configured to receive data from the detection electronics 158. The image processor 140 may also be communicatively coupled to the controller 130.

In accordance with an embodiment of the invention, the apparatus 150 may be configured such that a user may select a scanning mode wherein the stage 114 may be moved in a relatively slow and continuous (or nearly continuous) linear motion which is perpendicular to the scan line. Meanwhile, the optical beam 153 may be configured to illuminate an entire scan line such that all the pixels of a scan line may be acquired simultaneously using a time-delay integration (TDI) detector.

Image data collected during the scanning may then be processed by the image processor 140. This image data may be processed in accordance to the methods disclosed herein to detect and verify defects in a relatively rapid and efficient manner which allows for high-throughput inspection of substrates. The image processor 140 may include a processor 142, a memory 144, and input/output (I/O) circuitry 148. The memory 144 may include processor-executable code 146 and other data. The I/O circuitry 148 may be used by the controller to communicate with external electronic devices. The I/O circuitry 148 may be coupled to detection electronics 158 and the controller 130.

Figure 2:
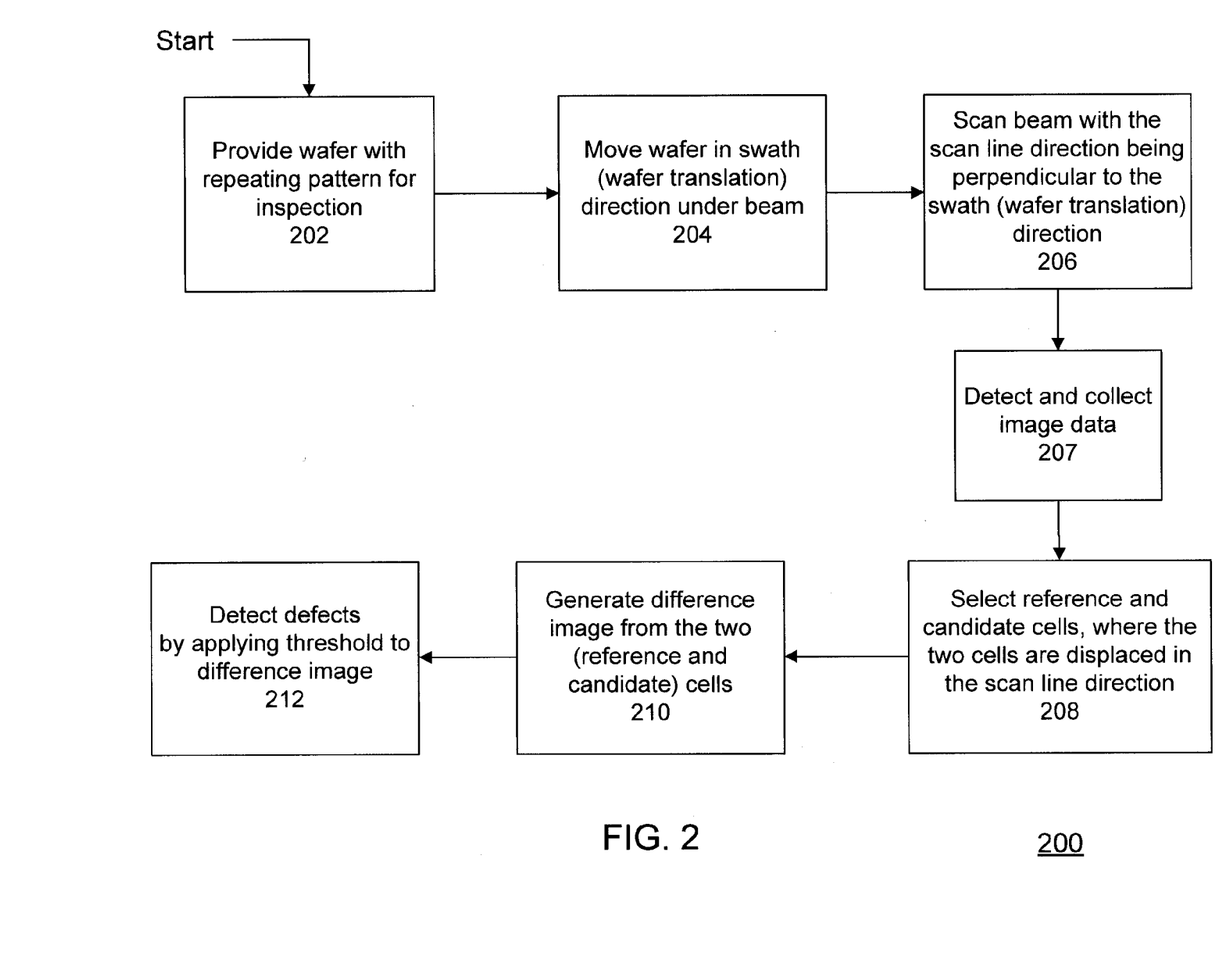
FIG. 2 is a flow chart of a method to detect a defect in a substrate in accordance with an embodiment of the invention.

FIG. 2 is a flow chart of a method to detect a defect in a substrate in accordance with an embodiment of the invention. A semiconductor wafer or other similar substrate is provided 202 to be inspected.

The wafer is translated or moved 204 in a "swath" (wafer translation) direction under a beam. The beam may be an electron beam generated by an electron column, for example, as shown in FIG. 1A, or the beam may be an optical beam generated by the optical source, for example, as shown in FIG. 1B. As the wafer is being translated under the beam in the swath direction, the beam is scanned 206 with the scan-line direction being perpendicular to the swath (wafer translation) direction. The combination of the wafer translation and scanning results in parallelogram-shaped (or rectangularly-shaped) regions (called "swaths") of the wafer surface being imaged.

Image data may be detected and collected 207, for example, by the electron detector 118 and detection electronics 128 shown in FIG. 1A, or by the optical detector 156 and detection electronics 158 shown in FIG. 1B. The image data may then be processed by the image processor 140. In accordance with an embodiment of the invention, the processing of the image data may include the following steps.

Figure 3:
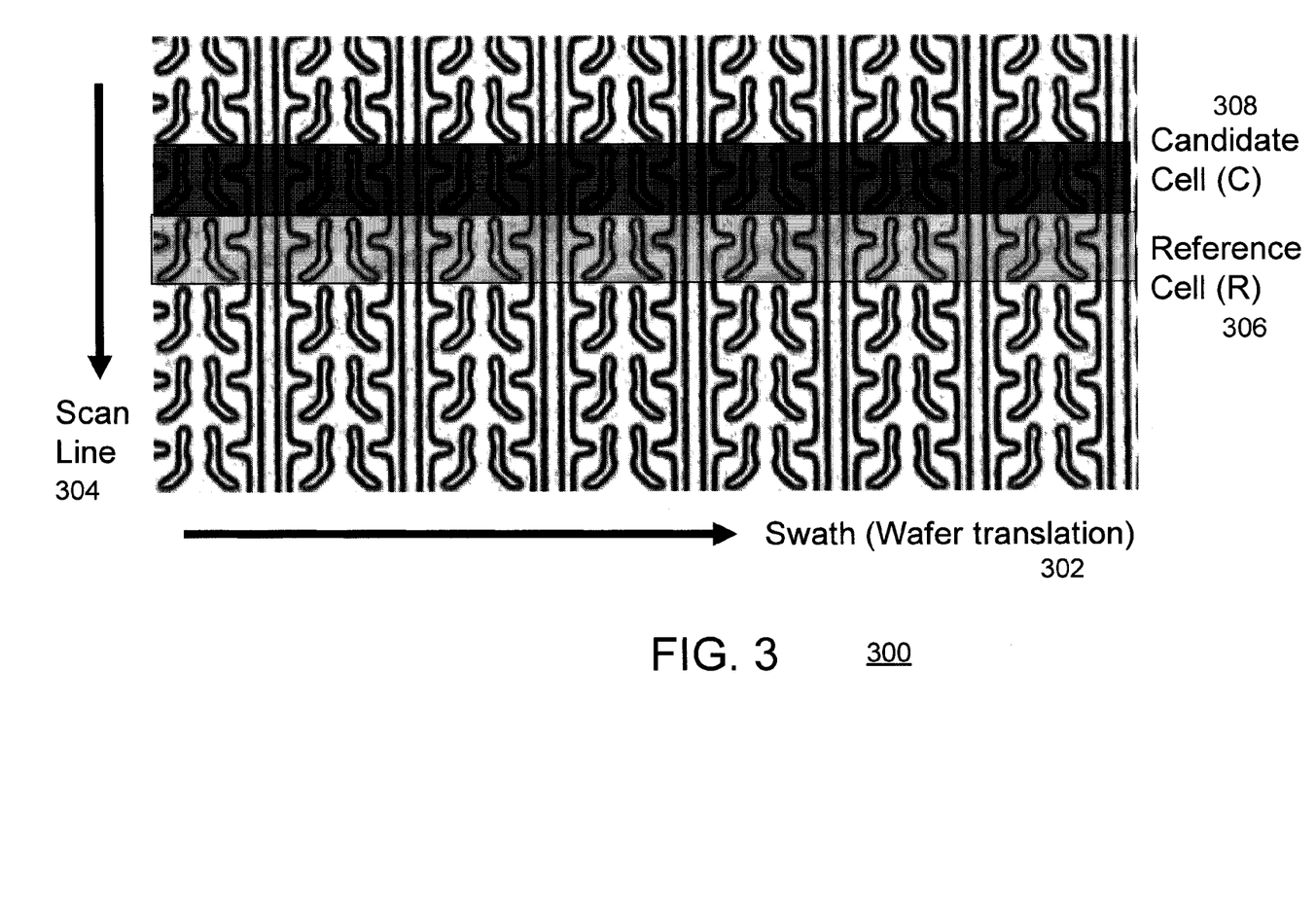
FIG. 3 is an illustrative diagram depicting a first pair of reference and candidate cells in accordance with an embodiment of the invention.

Reference and candidate cells within the image data are selected 208, where each pixel of one cell in the pair is displaced from a corresponding pixel of the other cell in the pair by one or multiple cell "heights" in the scan-line direction 304. In the absence of defects, the images of reference and candidate cells are expected to be substantially similar due to the repeating nature of the pattern on the semiconductor wafer. An example of one such first pair of reference and candidate cells, displaced by one cell "height" in the scan-line direction, is depicted in FIG. 3.

The image data of one of the pair of cells is subtracted from the image data of the other cell of the pair. In other words, a difference image is generated 210, where the difference image may be generated by taking an intensity value for each image pixel in the candidate cell and subtracting the intensity value for the corresponding image pixel in the reference cell.

Defects in the candidate cell may then be detected 212 by applying a threshold to the difference image. For example, if the difference image indicates that certain pixels have differences in intensity values higher than the threshold, those pixels may be considered to be indicative of a defect.

Note that using cells displaced in the scan-line direction to generate a difference image per the above-discussed method 200 is not normally done in conventional practice. This is because the conventional wisdom is that using cells displaced in the swath (wafer translation) direction avoids aberrations in the difference image due to lens distortions. In contrast, by using the above-discussed method 200, the aberrations due to lens distortions are avoided because corresponding pixels in both cells would experience the same distortion, and so the distortion would cancel out in generating the difference image.

Applicants have found that the above-discussed method 200 provides a substantial and unexpectedly useful advantage in that Δt is much shorter than in the conventional method. In other words, pixels subtracted from each other to create the difference image have a much smaller difference in acquisition times than in the conventional technique. More particularly, applicants have found Δt to be in the range from 10 nanoseconds to 1 microsecond by using the above-discussed technique with an electron beam apparatus. This is orders of magnitude shorter than the conventional technique with an electron beam apparatus which typically results in Δt ranging from 100 microseconds to 10 milliseconds.

Applicants have further found that the substantially shorter Δt of the above-discussed method 200 results in much less time for the inspection tool to accumulate systematic errors distorting the image. This lower distortion noise yields a difference image with less noise for subsequent defect detection.

The above-discussed method 200 has the further advantage of being much less sensitive to image aliasing that can occur when an image is under-sampled from one scan line to the next. Furthermore, noise from beam current fluctuations and small glitches is much more likely to affect the conventionally-generated difference image (between cells displaced in the wafer translation direction) than the difference image generated using the above-discussed method 200.

In another embodiment, the above-discussed method 200 may be extended by modifying block 208 to select multiple reference cells and by modifying block 210 to generate multiple difference images, each difference image being between the candidate cell and one of the reference cells. Advantageously, the multiple difference images may be used for arbitration purposes to make the defect detection more robust. For example, if three difference images are generated using three reference cells, then the algorithm may require that a defect be detected only if the defect passes the threshold application (in a modified block 212) in at least two of the three difference images.

FIG. 3 is an illustrative diagram depicting a first pair of reference and candidate cells in accordance with an embodiment of the invention. This illustrative diagram shows example image data and further shows the swath (wafer or substrate translation) direction 302 and the scan-line direction 304. As seen, the swath and scan-line directions are perpendicular to each other.

A reference cell 306 and a candidate cell 308 are also shown. In this instance, each pixel of one cell in the pair is displaced from a corresponding pixel of the other cell in the pair by one cell "height" in the scan-line direction 304. (In other instances, the displacement between the cells may be multiple cell "heights".) In the absence of defects, the images of reference and candidate cells are expected to be substantially similar due to the repeating nature of the pattern on the semiconductor wafer.

Figure 4A:
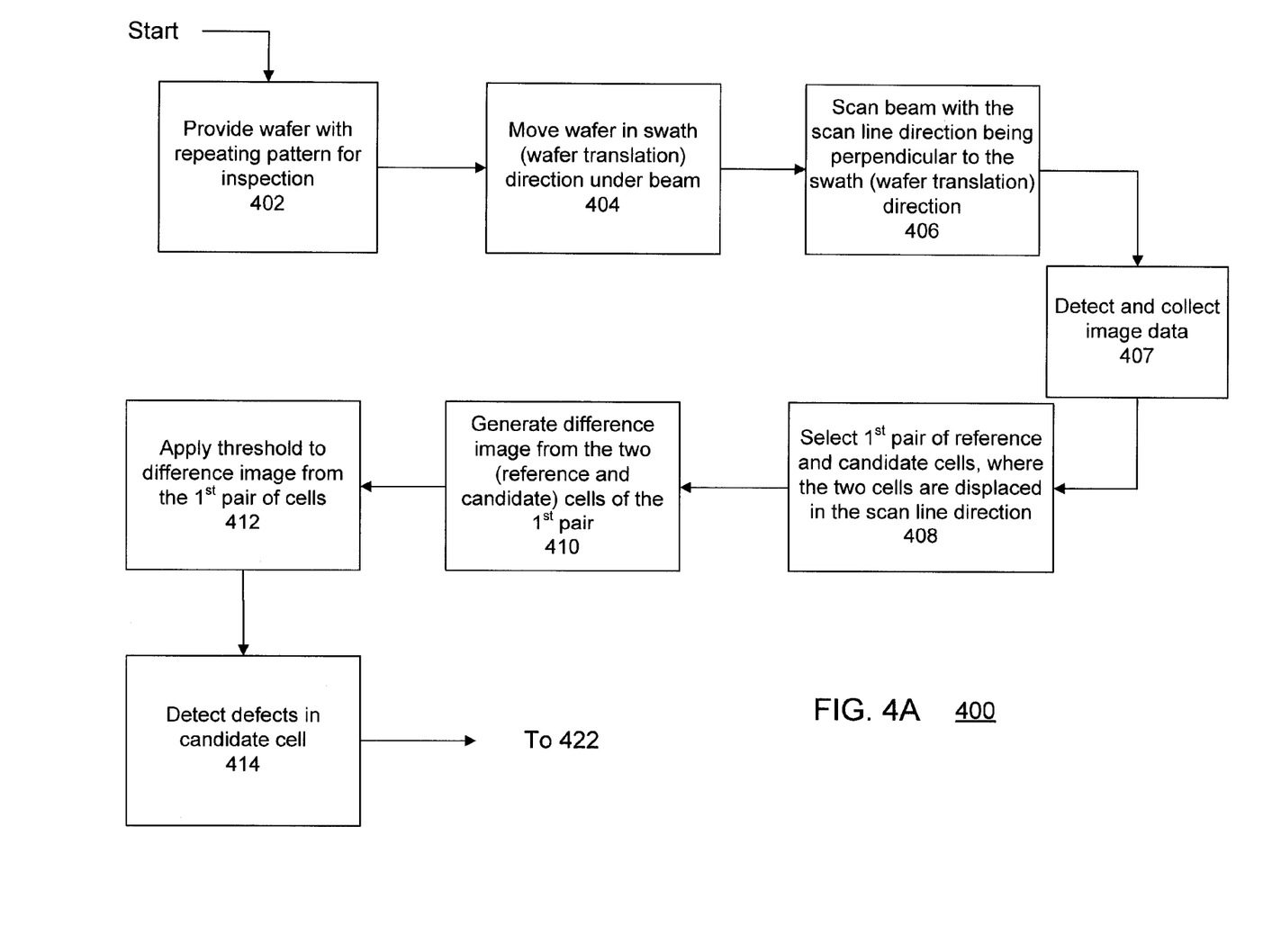
FIGS. 4A and 4B depict steps in a method to detect and verify a defect in a substrate in accordance with an embodiment of the invention.
Figure 4B:
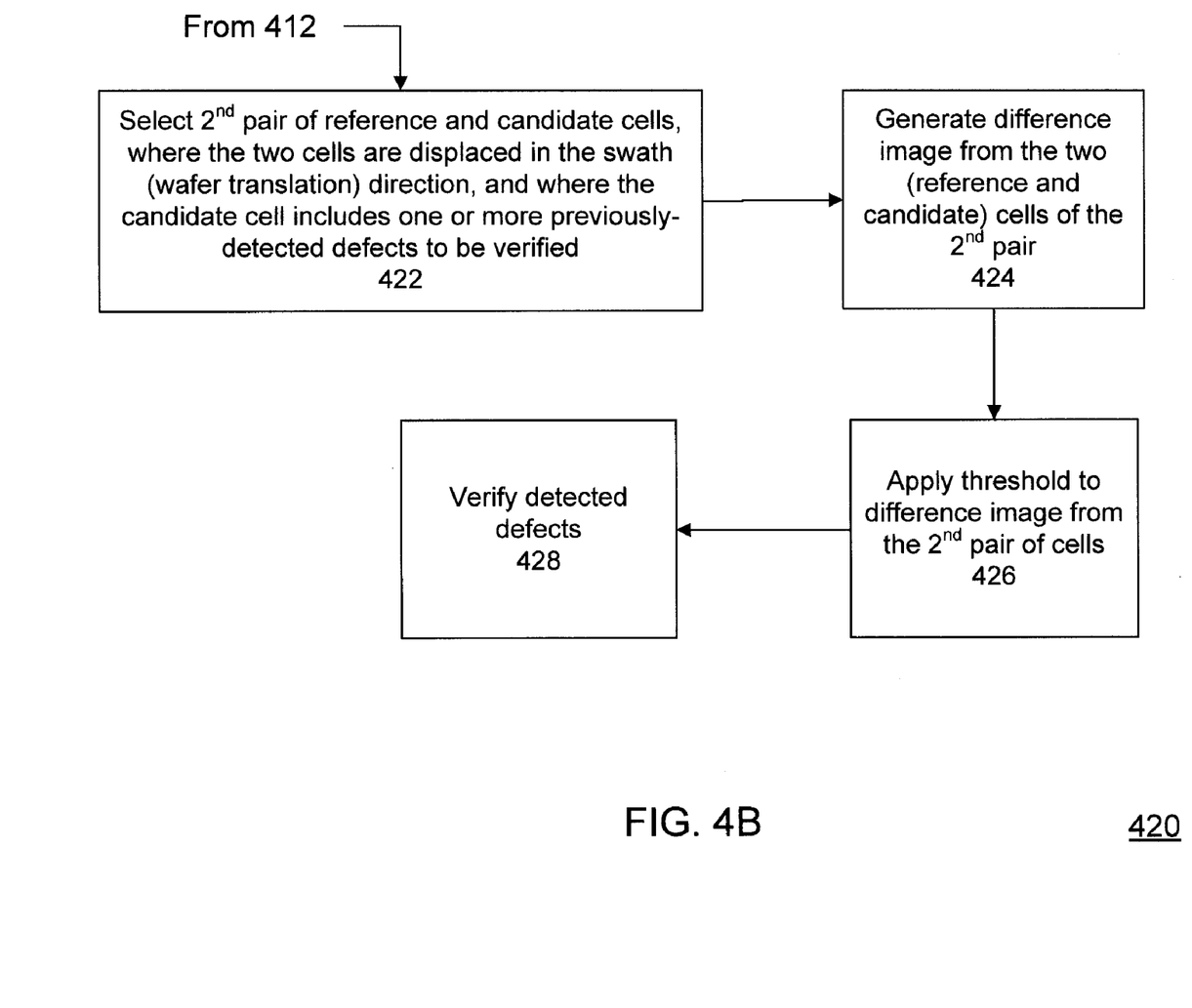

FIGS. 4A and 4B depict steps in a method to detect and verify a defect in a substrate in accordance with an embodiment of the invention. The method starts with the process 400 shown in FIG. 4A.

A semiconductor wafer or other similar substrate is provided 402 to be inspected, and the wafer is translated or moved 404 in a "swath" (wafer translation) direction under a beam, for example, such as the electron beam of the apparatus 100 discussed above in relation to FIG. 1A, or the optical beam of the apparatus 150 discussed above in relation to FIG. 1B. As the wafer is being translated under the beam in the swath direction, the beam is scanned 406 with the scan-line direction being perpendicular to the swath (wafer translation) direction. The combination of the wafer translation and scanning results in parallelogram-shaped (or rectangularly-shaped) regions (called "swaths") of the wafer surface being imaged.

Image data may be detected and collected 407 by the electron detector 118 and detection electronics 120. The image data may then be processed by the image processor 140. In accordance with an embodiment of the invention, the processing of the image data may include the following steps.

A first pair of reference and candidate cells within the image data is selected 408, where each pixel of one cell in the pair is displaced from a corresponding pixel of the other cell in the pair by one or multiple cell "heights" in the scan-line direction 304. In the absence of defects, the images of reference and candidate cells are expected to be substantially similar due to the repeating nature of the pattern on the semiconductor wafer. An example of one such first pair of reference and candidate cells, displaced by one cell "height" in the scan-line direction, is depicted in FIG. 3.

The image data of one of the first pair of cells is subtracted from the image data of the other cell of the first pair. In other words, difference data is generated 410, where the difference data may be generated by taking an intensity value for each image pixel in the candidate cell of the first pair and subtracting the intensity value for the corresponding image pixel in the reference cell of the first pair.

Defects in the candidate cell of the first pair may then be detected 412 by applying a threshold to the difference data. For example, if the difference data indicates that certain pixels have differences in intensity values higher than the threshold, those pixels may be considered to be indicative of a defect.

Figure 5:
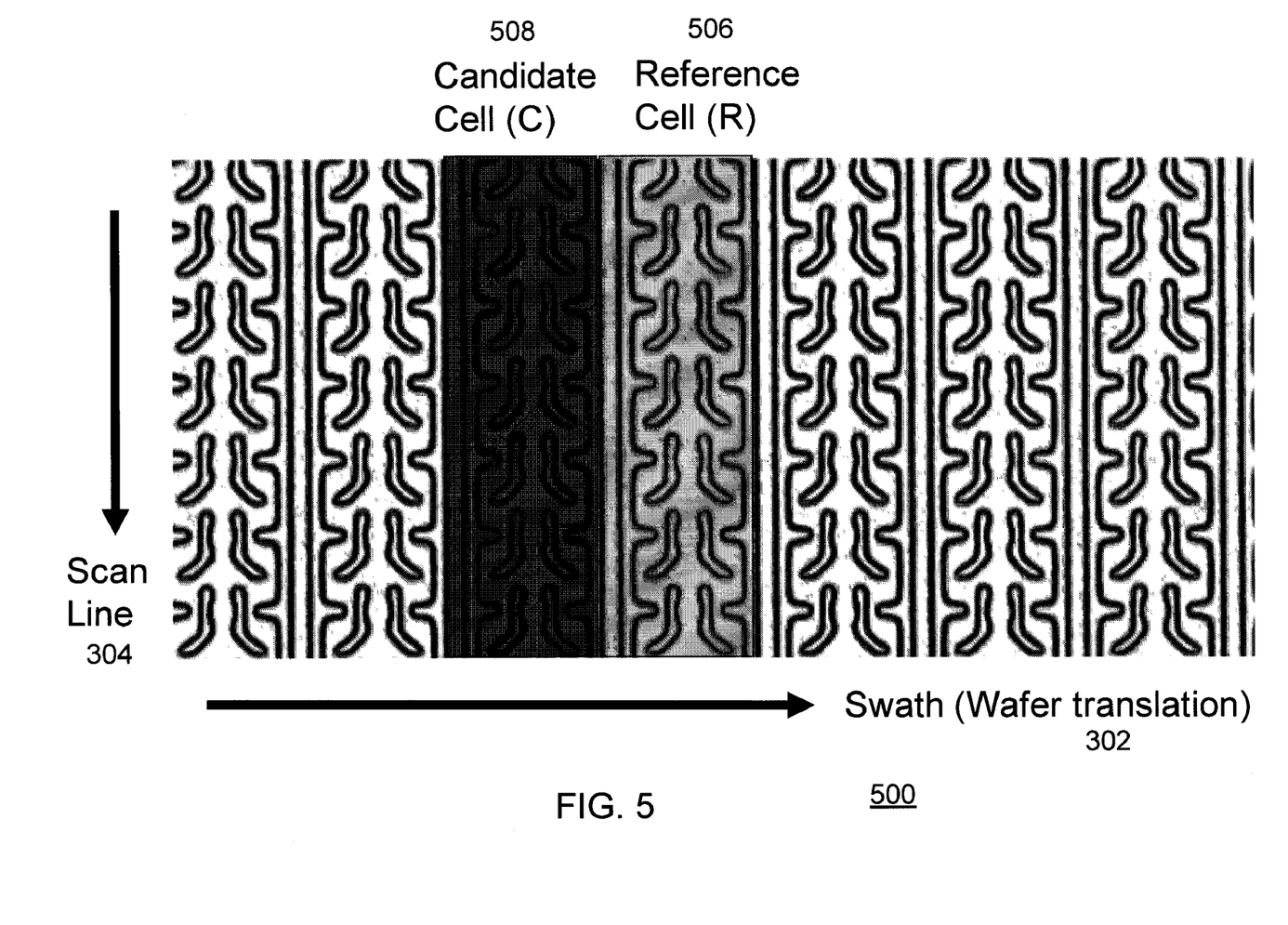
FIG. 5 is an illustrative diagram depicting a second pair of reference and candidate cells in accordance with an embodiment of the invention.

The method continues with the process 420 shown in FIG. 4B. A second pair of reference and candidate cells within the image data is selected 422, where each pixel of one cell in the pair is displaced from a corresponding pixel of the other cell in the pair by one or multiple cell "widths" in the swath (wafer translation) direction 302. In the absence of defects, the images of reference and candidate cells are expected to be substantially similar due to the repeating nature of the pattern on the semiconductor wafer. An example of one such first pair of reference and candidate cells, displaced by one cell "width" in the scan-line direction, is depicted in FIG. 5. (Note that, while the example candidate cells 308 and 508 in FIGS. 3 and 5 are depicted as having different shapes and covering different regions, one embodiment of the invention may select candidate cells 308 and 508 to be of the same shape and cover the same region. In other words, the candidate cells 308 and 508 may be the same cell.)

The image data of one of the second pair of cells is subtracted from the image data of the other cell of the second pair.

In other words, difference data is generated 424, where the difference data may be generated by taking an intensity value for each image pixel in the candidate cell of the second pair and subtracting the intensity value for the corresponding image pixel in the reference cell of the second pair.

Defects in the candidate cell of the second pair may then be detected 426 by applying a threshold to the difference data. For example, if the difference data indicates that certain pixels have differences in intensity values higher than the threshold, those pixels may be considered to be indicative of a defect.

By comparing the pixels indicative of a defect found in step 412 to the pixels indicative of a defect found in step 426, any such defects may be verified 428. In particular, if the difference data from both the first and second pairs of cells indicates a defect, then the defect may be deemed as verified. On the other hand, if one set of difference data (for example, from the first pair of cells) indicates a defect, but the other set of difference data (for example, from the second pair of cells) does not, then the defect would remain unverified and may be deemed a false defect or undergo further analysis.

FIG. 5 is an illustrative diagram depicting a second pair of reference and candidate cells in accordance with an embodiment of the invention. This illustrative diagram shows example electron image data and further shows the swath (wafer translation) direction 302 and the scan-line direction 304. As seen, the swath and scan-line directions are perpendicular to each other.

An example cell pair, including a reference cell 506 and a candidate cell 508, is also shown. In this instance, each pixel of one cell in the pair is displaced from a corresponding pixel of the other cell in the pair by one cell "width" in the swath (wafer translation) direction 302. (In other instances, the displacement between the cells may be multiple cell "widths".) In the absence of defects, the images of reference and candidate cells are expected to be substantially similar due to the repeating nature of the pattern on the semiconductor wafer.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for automated inspection of a substrate comprising:
    a movable stage configured to hold the substrate having a repeating pattern of cells formed on a surface thereof;
    stage electronics configured to control the movable stage;
    a controller including a processor and memory;
    a controllable beam source for generating a beam and scanning the beam over the surface of the substrate;
    a detector for detecting image data;
    processor-executable code configured to control the stage electronics to move the substrate under the beam using a continuous motion in a substrate-translation direction;
    processor-executable code configured to scan the beam over the surface of the substrate and collect corresponding image data, wherein scan lines of the scan are in a scan-line direction perpendicular to the substrate-translation direction;
    processor-executable code configured to select from the image data a first pair of two cells of the repeating pattern on the surface of the substrate, wherein the two cells in the first pair comprise a candidate cell and a reference cell;
    processor-executable code configured to generate a first difference image by subtracting image data from said two cells of the first pair on a pixel-by-pixel basis;
    processor-executable code configured to select from the image data a second pair of two cells of the repeating pattern on the surface of the substrate, wherein one of the two cells is the candidate cell of the first pair, and wherein the two cells in the second pair are displaced from each other by one or multiple cell widths in the substrate-translation direction;
    processor-executable code configured to generate a second difference image by subtracting image data from said two cells of the second pair on a pixel-by-pixel basis; and
    processor-executable code configured to verify a defect found in the candidate cell using the first difference image if the defect is also found in the second difference image.

2. The apparatus of claim 1, further comprising:
    processor-executable code configured to apply a first threshold to the first difference image and to detect defects using pixel values in the first difference image that exceed the first threshold; and
    processor-executable code configured to apply a second threshold to the second difference image and to verify defects using pixel values in the second difference image that exceed the second threshold.

3. The apparatus of claim 1, wherein the beam comprises an electron beam.

4. The apparatus of claim 3, wherein individual pixels that are subtracted from each other to form the first difference image are acquired a time period apart, and wherein said time period is within a range from 10 nanoseconds to 1 microsecond.

5. The apparatus of claim 1, wherein the beam comprises an optical beam.

* * * * *